(12) United States Patent
Aratani et al.

(10) Patent No.: US 6,439,058 B1
(45) Date of Patent: Aug. 27, 2002

(54) SEMICONDUCTOR SENSOR

(75) Inventors: Masahiro Aratani; Yasuaki Makino, both of Okazaki (JP)

(73) Assignee: Denso Corporation, Kariya (JP)

( * ) Notice: Subject to any disclaimer, the term of this patent is extended or adjusted under 35 U.S.C. 154(b) by 59 days.

(21) Appl. No.: 09/678,846

(22) Filed: Oct. 4, 2000

(30) Foreign Application Priority Data

Oct. 6, 1999 (JP) .......................................... 11-285938

(51) Int. Cl.$^7$ .............................. G01L 7/00; G01L 9/00
(52) U.S. Cl. .......................................... 73/756; 73/754
(58) Field of Search .................... 73/754, 715, 716, 73/717, 718–721, 725–727, 756

(56) References Cited

U.S. PATENT DOCUMENTS

| | | | | |
|---|---|---|---|---|
| 4,870,863 A | * | 10/1989 | Duncan et al. | 200/56 R |
| 5,184,107 A | * | 2/1993 | Maurer | 29/621.1 |
| 5,257,547 A | * | 11/1993 | Boyer | 338/4 |
| 5,828,290 A | * | 10/1998 | Buss et al. | 123/399 |
| 5,900,554 A | * | 5/1999 | Baba et al. | 73/725 |
| 5,948,991 A | * | 9/1999 | Nomura et al. | 73/727 |
| 6,131,467 A | * | 10/2000 | Miyano et al. | 73/756 |

FOREIGN PATENT DOCUMENTS

| | | |
|---|---|---|
| JP | 8-54305 | 2/1996 |
| JP | 9-178591 | 7/1997 |

* cited by examiner

*Primary Examiner*—Max Noori
(74) *Attorney, Agent, or Firm*—Law Offices of David G. Posz

(57) ABSTRACT

A semiconductor pressure sensor in which a semiconductor sensor element is contained in a package which is made by assembling a first case and a second case, and which have simple structure with low cost. The semiconductor pressure sensor is generally made up of a sensor element made of semiconductor; a sensor case made of resin; plural leads insert-formed into the sensor case so as to be partly exposed from the sensor case, wherein the leads is electrically connected to the sensor element; and a connector case assembled with the sensor case for covering the sensor element. The connector case has a flange portion which is provided with a cover portion, and a surround portion protruding from the cover portion for surrounding an exposed portion of the leads. The surround portion and the exposed portion form a connecting portion which can be connected with an external terminal. Hence, connecting function of the sensor can be realized with simple structure without additional connecting members.

12 Claims, 5 Drawing Sheets

SEMICONDUCTOR SENSOR

CROSS REFERENCE TO RELATED APPLICATION

This application is based upon Japanese Patent Application No. Hei. 11-285938 filed on Oct. 6, 1999, the contents of which are incorporated herein by reference.

BACKGROUND OF THE INVENTION

1. Field of the Invention

This invention relates to semiconductor sensors, and particular to a semiconductor sensor in which a semiconductor sensor element is contained in a package which is made by assembling a first case and a second case.

2. Related Art

Conventional semiconductor sensors such as semiconductor pressure sensors have been-proposed in JP A 8-54305, JP A 9-178591 etc. This kind of semiconductor pressure sensor has an element side case on which a semiconductor sensor element and a circuit board are mounted; and a connector case into which leads for taking signals are insert-formed, which is assembled with the element side case, so that the semiconductor sensor element and the circuit board are contained in a package made up of the element side case and the connector case.

According to the conventional semiconductor sensors, when the leads of the connector case are electrically connected to the semiconductor sensor element and circuit board, it needs to weld or solder the leads to connecting portions which are additionally provided to the element side case. Therefore, the number of the parts constituting the connecting portions will be increased and the structure itself will be complicated. Furthermore, since both cases are assembled by using adhesive or swaging, the number of processes or the investment of equipments will be increased, and therefore total cost will be increased.

SUMMARY OF THE INVENTION

This invention has been conceived in view of the background thus far described and its first object is to provide semiconductor sensors having simple structure with low cost.

Its second object is to provide semiconductor sensors in which a semiconductor sensor element is contained in a package which is made by assembling a first case and a second case, and which have simple structure with low cost.

According to the present invention, a semiconductor sensor comprising: a first case made of resin in which a semiconductor sensor element being provided; a lead insert-formed in the first case so that a part of the lead being exposed from the first case, the lead being electrically connected to the semiconductor sensor element; and a second case assembled with the first case, for covering the semiconductor sensor element, the second case having a surround portion for surrounding an exposed portion of the lead. Here, a connector portion for connecting the exposed portion with an external terminal is made up of the exposed portion and the surround portion.

According to the present invention, since the lead forms the connector portion with the surround portion to be connected to the external terminal, connecting function can be realized with simple structure without additional connecting members. Furthermore, since the lead is insert-formed in the sensor case in advance, it is not necessary to additionally weld or solder the lead. Therefore, it can provide a semiconductor sensor having a simple structure with low cost.

BRIEF DESCRIPTION OF THE DRAWINGS

These and another objects, features and characteristics of the present invention will be appreciated from a study of the following detailed description, the appended claims, and drawings, all of which form parts of this application. In the drawings, same portions or corresponding portions are put the same numerals each other to eliminate redundant explanation. In the drawings:

DESCRIPTION OF THE PREFERRED EMBODIMENTS

Hereinafter, a preferred embodiment of the present invention will be explained with reference to the accompanying drawings.

In this embodiment, the present invention is applied to a semiconductor pressure sensor. This kind of semiconductor pressure sensor is applicable to, for example, a water level sensor to be provided to a hot water (or water) passage from a hot water feeder to a bath to detect a water level in the bath by detecting pressure in the passage.

FIGS. 1 to 6 show detail structure of the semiconductor pressure sensor 100 (hereinafter, called as "sensor 100"). The sensor 100 is generally made up of a sensor element 10 made of semiconductor; a sensor case (first case) 20 made of resin; plural leads 30 inserted (insert-formed) into the sensor case 20 so as to be partly exposed from the sensor case 20, wherein the leads 30 are electrically connected to the sensor element 10; and a connector case (second case) 40 assembled with the sensor case for covering the sensor element 10.

Figure 2:
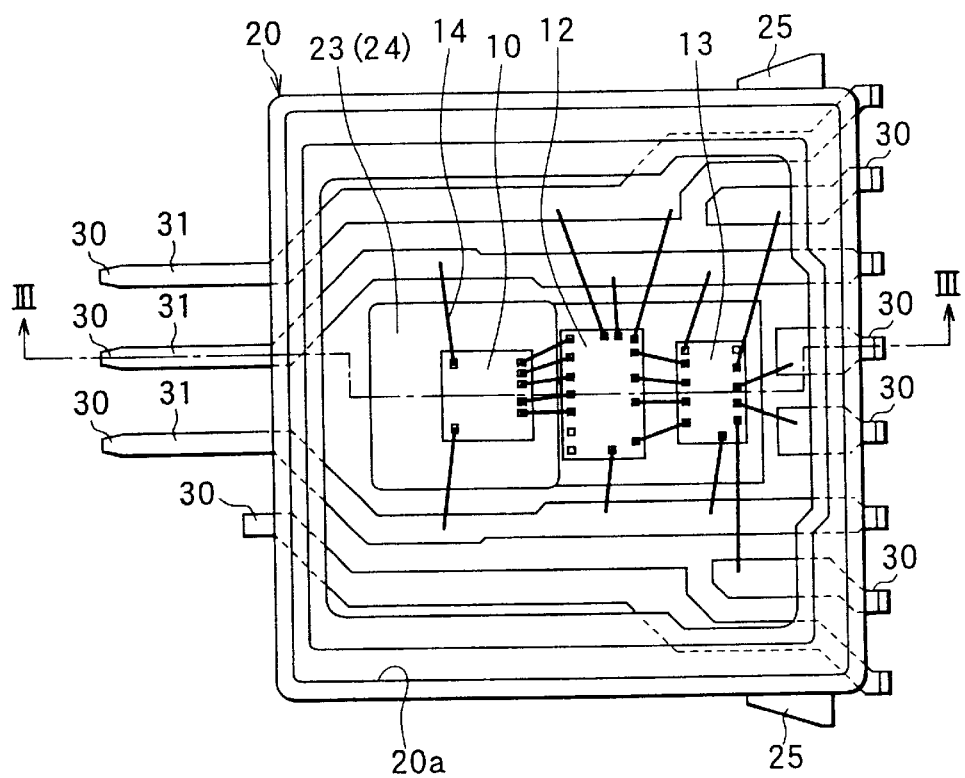
FIG. 2 is a plan view of a sensor case of the semiconductor pressure sensor.
Figure 3:
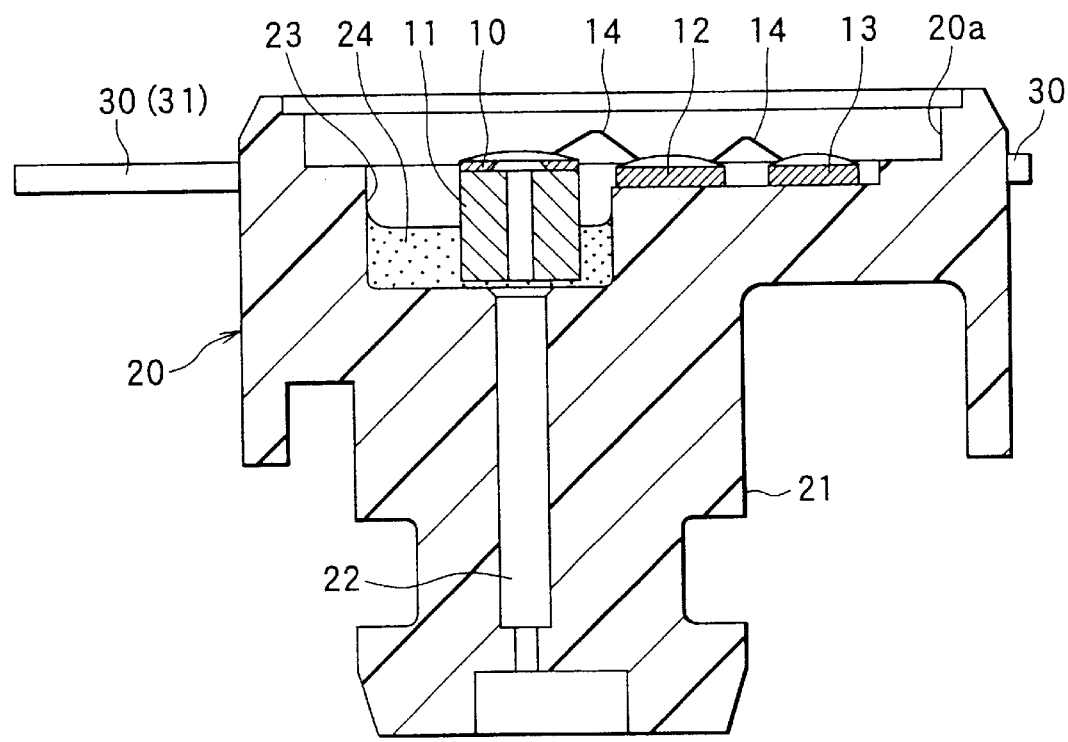
FIG. 3 is a sectional view of the sensor case taken along a line III—III in FIG. 2.
Figure 4:
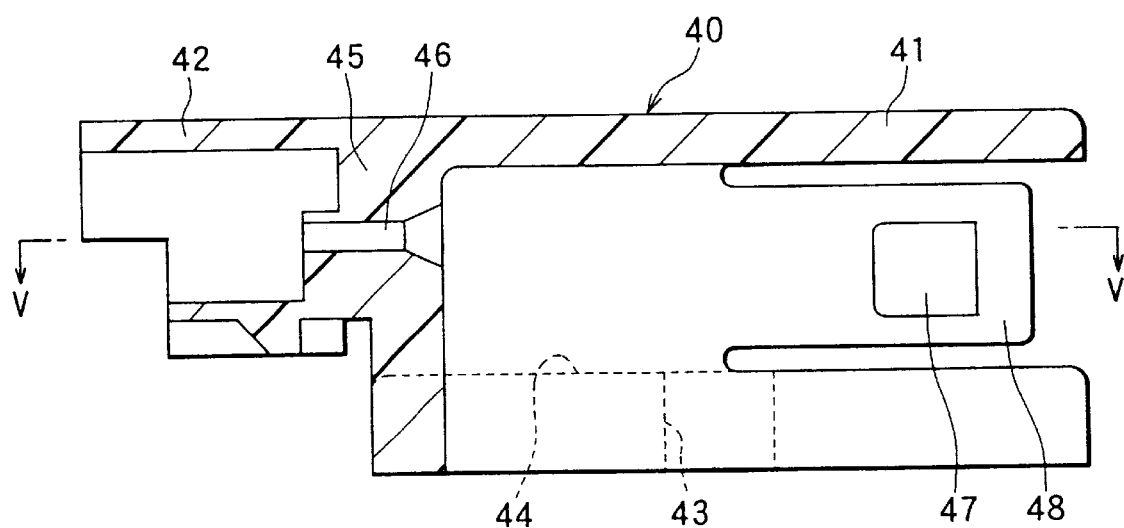
FIG. 4 is a plan view of a connector case of the semiconductor pressure sensor.
Figure 5:
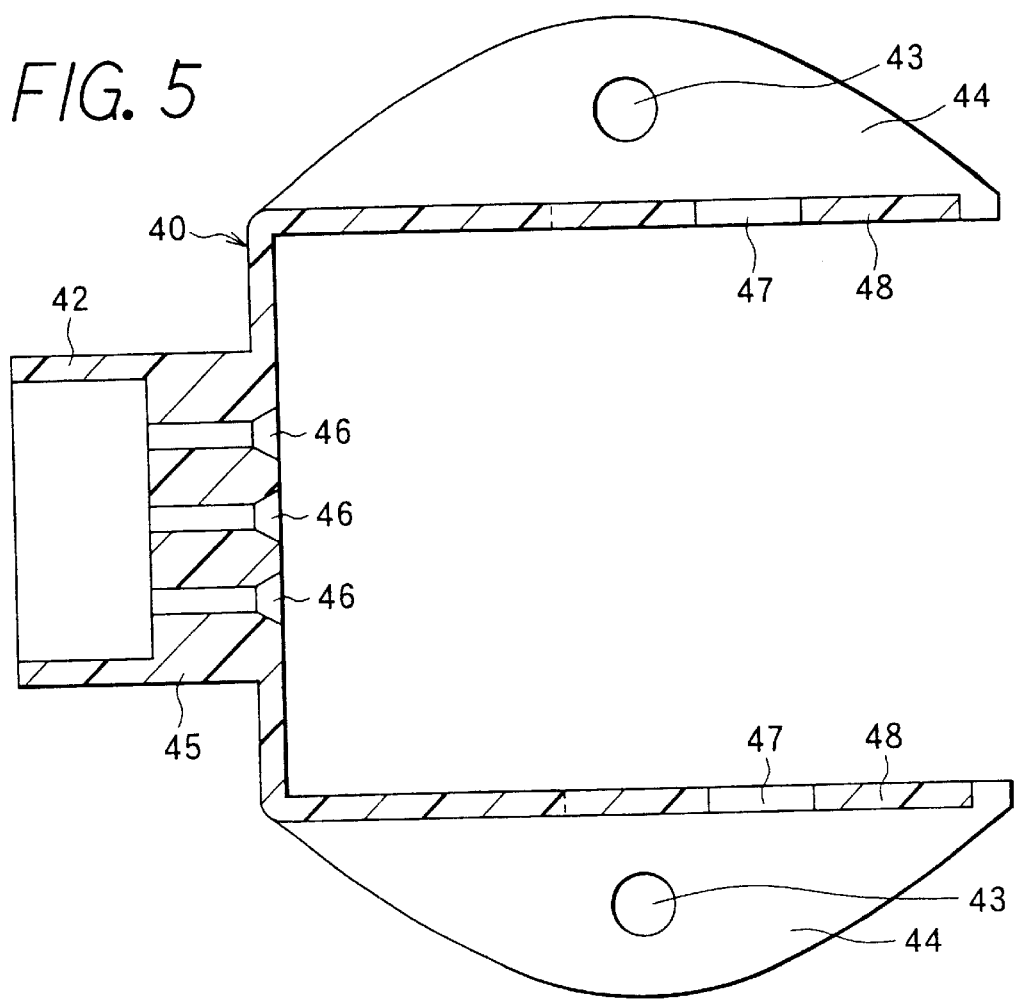
FIG. 5 is a sectional view of the connector case taken along a line V—V in FIG. 4.

The sensor case 20 is made of plastic material such as PPS (polyphenylene sulfide) or PBT (polybutylene terephthalate). As shown in FIGS. 2 and 3, the sensor case 20 is provided with an opening portion 20a at a one side thereof at which the sensor element 10 and so on are provided, and a pressure introduce port 21 protruding from a bottom surface of the opening portion 20a to an opposite side of the sensor element 10. A tip of the pressure introduce port 21 can be mounted to a predetermined portion of the passage of the hot water feeder via an O-ring or the like. An introduce hole 22 for introducing pressure from the passage is provided in the pressure introduce port 21.

A depression portion 23 which is depressed from a flat portion is formed at the bottom of the opening portion 20a of the sensor case 20. The sensor element 10 is fixed in the depression portion 23 via a seat 11 made of glass or the like. The sensor element 10 has a structure in which plural diffusion resistors are formed on a diaphragm, made of a semiconductor material having the piezoresistance effect (such as a monocrystalline silicon), and in which these diffusion resistances are connected to form a bridge circuit so that changes of resistance of the diffusion resistors in response to deformation of the diaphragm are taken out from the bridge circuit as electric signals.

The sensor element 10 is bonded with the seat 11 by way of glass bonding or the like. The seat 11 has a through hole therein to communicate with the introduce hole 22. The pressure from the passage is transmitted from the introduce hole 22 to the diaphragm of the sensor element 10 through the through hole of the seat 11. Sealer (sealing agent) 24 such as silicon gel or resin adhesive is filled with the depression portion 23 to improve airtightness between the through hole of the seat 11 and the introduce hole 22.

Each of the leads 30 has a plate band shape, and is insert-formed in the sensor case 20 to be integrally formed with the sensor case 20. The leads 30 can be made of conventional lead frame material such as phosphor bronze plated with electro nickel plating. Here, three exposed portions 31 of the leads 30 which are largely exposed from an outer wall of the sensor case 20, as described in FIG. 2, are formed so that the electric signals (outputs) from the sensor element 10 are externally taken out.

Figure 1:
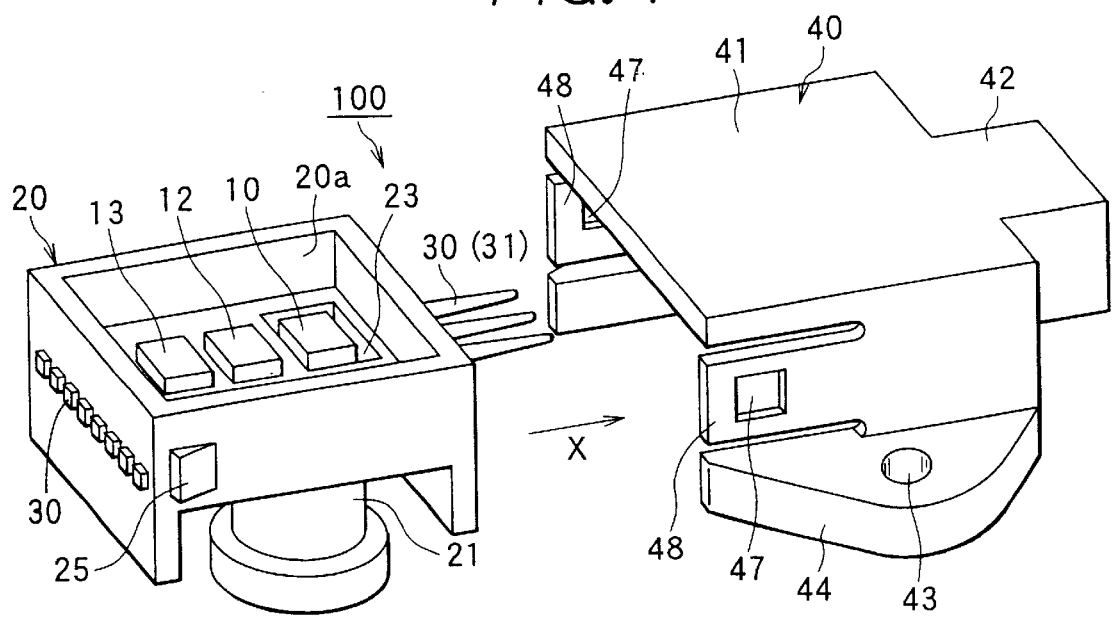
FIG. 1 is an exploded perspective view of a semiconductor pressure sensor of a preferred embodiment, before two cases are assembled, according to the present invention.

As shown in FIGS. 1 to 3, a transistor element 12 and a MOS transistor 13 are fixed to the opening portion 20a of the sensor case 20 by using adhesive. The transistor element 12 acts as an amplifier for amplifying the output signal from the sensor element 10, and the MOS transistor 13 acts as an adjusting circuit for adjusting the signals from the sensor element or bipolar transistor element.

As shown in FIGS. 2 and 3, the sensor element 10, the bipolar transistor element 12, the MOS transistor element 13 and leads 30 are electrically connected using plural wires (shown by bold line) 14 made up of wire bonding using gold or aluminum or the like. The electric signals (output) from the sensor element 10 is externally taken out from each element 12 and 13, leads 30 and exposed portion 31 of the lead through wires 14.

Here, as shown in FIG. 3, the leads 30 are arranged to along the flat portion of the bottom surface of the opening portion 20a. Each of the leads 30 has a flat shape so that a flat portion positions coplanar with a surface to which the wires 14 are connected (the surface which is electrically connected to the sensor element 10). This is because, as described later, a lead structure suitable for conventional hoop forming can be achieved. Here, in FIG. 1, side step portions in the opening portion 20a, the leads 30 and the wires 14 each of which is formed in the opening portion 20a of the sensor case 20 are omitted.

The connector case 40, which covers the sensor element 10 by being assembled with the sensor 20, is formed by injecting resin such as PPS or PBT alike the sensor case 20. An inner shape corresponds to an outer shape of the sensor case 20. The connector case 40 has a flange portion 44. The flange portion 44 is provided with a cover portion 41 for covering the opening portion 20a of the sensor case 20, a surround portion 42 protruding from the cover portion 41 for surrounding the exposed portion 31 of the leads 30, and a fix hole 43 for fixing the sensor 100 to an adequate portion of the passage of the hot water feeder.

Figure 6:
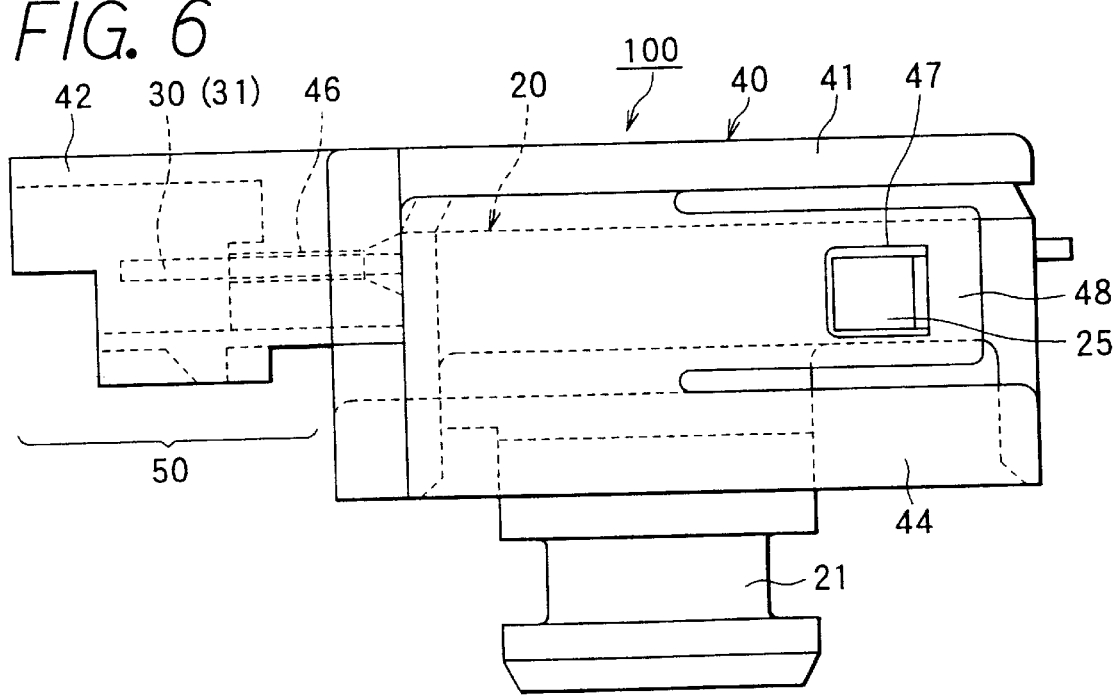
FIG. 6 is a perspective view of the semiconductor pressure sensor of a preferred embodiment, after two cases are assembled.

The surround portion 42 has a substantially quadrilateral tube body, and surrounds the exposed portion 31 of the lead 30 with having a predetermined distance between the exposed portion 31 and an inner wall of the tube body. The connector case 40 has a wall portion 45 between the surround portion 42 and the cover portion 41. The wall portion 45 is provided with a hole portion 46 into which the exposed portion 31 of the lead 30 is inserted and is supported. As shown in FIG. 6, the surround portion 42 and the exposed portion 31 of the lead 30 form the connecting portion 50 which can be connected with an external terminal. The connecting portion 50 can be connected with the conventional connector member by fitting therewith.

The connector 40 and the sensor case 20 are assembled by inserting and fitting a protrusion provided to one of them into a hole portion provided to another of them. That is, the connector 40 and the sensor case 20 are assembled by so-called snap fit. In this embodiment, a hook portion 25 as the protrusion is respectively provided to each of the both external wall surfaces of the sensor case 20. The hook hole 47 as the hole portion is respectively provided to each of the both external wall surfaces of the connector case 40 at a portion corresponding to the hook portion 25.

The hook portion 25 is formed to be a tapered shape so that a degree of protrusion is gradually increased along a direction X in FIG. 1, that is a direction the sensor case 20 is inserted to the connector case 40. In other words, the hook portion 25 has a slant surface at a side of inserting direction of the sensor case 20. Furthermore, on the outer wall surface of the connector case 40, a slit is formed by partly cutting off along the inserting direction, so that a bending portion 48 having a plate (flat) shape which can elastically deform toward a direction perpendicular to the outer wall surface. The hook hole 47 is provided to the bending portion 48 as a through hole penetrating to a thickness direction.

Figure 7A:
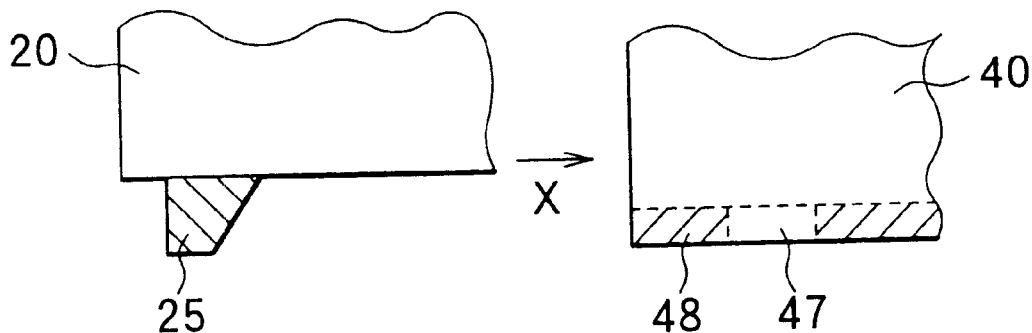
FIGS. 7A, 7B and 7C are diagrams illustrating assembling steps between two cases.

Here, a method of assembling both cases 20 and 40 will be explained by using a connection operation between the hook hole 47 and the bending portion 48 shown in FIGS. 7A–7C. Here, hatching in FIGS. 7A–7C is putted for convenience, and does not indicate sectional portions.

Before being assembled, each element is mounted on the sensor case 20 and the wire bonding is conducted in the sensor case 20. After that, the sensor case 20 is inserted to the connector case 40 along the inserting direction so that the exposed portion 31 of the lead 30 is inserted to the hole portion 46 of the connector case 40 (see FIGS. 1 and 7A).

Figure 7B:
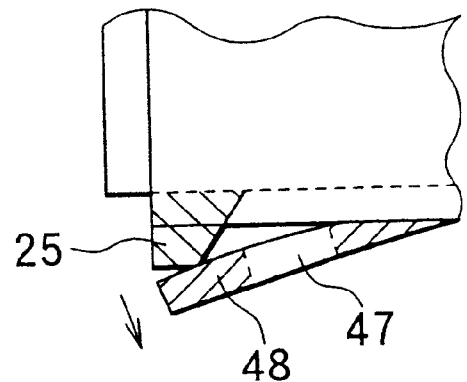
Figure 7C:
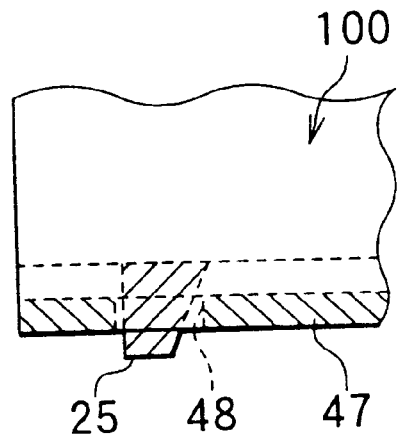

After that, the hook portion 25 contacts with the tip of the bending portion 48, and the bending portion 48 is elastically bent so that the bending portion 48 is outwardly expanded due to the slant surface of the hook portion 25 (FIG. 7B). Furthermore, when the sensor case 20 is further inserted, the hook portion 25 fits to the hook hole 47, and the bending portion 48 returns to the initial position due to elastic force (FIG. 7C). In this way, the hook portion 25 is hooked to the hook hole 47 so that both cases are connected as shown in FIG. 6.

Figure 8A:
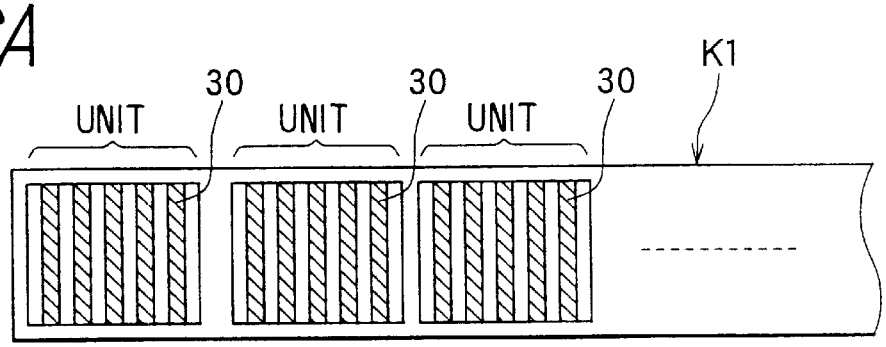
FIGS. 8A, 8B and 8C are schematic diagrams illustrating a method of manufacturing the sensor case.
Figure 8B:
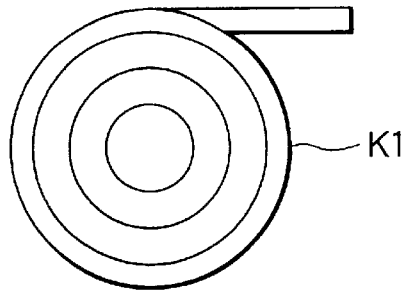
Figure 8C:
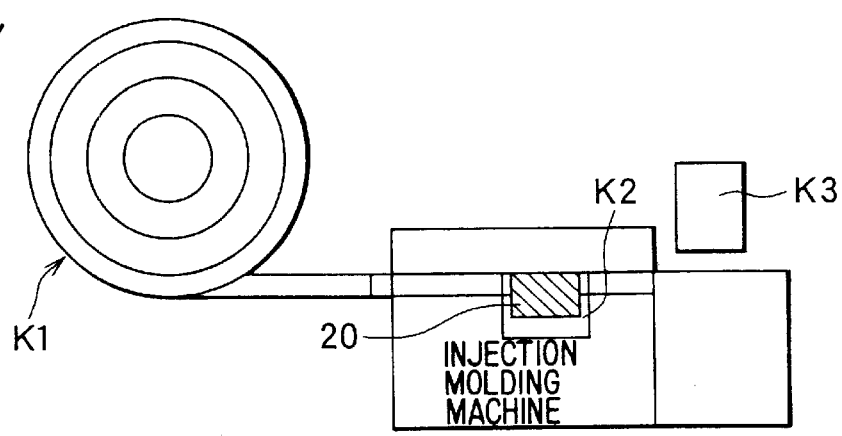

Next, a method of manufacturing the sensor case 20 will be explained. As described in the above, the leads 30 have the plate lead shape suitable for the well-known hook forming. The sensor case 20 is formed by the hoop forming. FIGS. 8A–8C schematically show the manufacturing steps.

At first, a band shape lead frame K1 is prepared. When plural leads 30 to be used for one sensor 100 is defined as one unit, plural units are linearly formed in this lead frame K1 (FIG. 8A).

This lead frame K1 is rolled onto another reel to become a coil condition (FIG. 8B). Here, since the lead 30 has the flat shape, the lead frame K1 itself can be formed into the flat band shape, and therefore the lead frame K1 can be rolled into the coil condition. The lead frame K1 under the coil condition is mounted on a rotatably shaft (not-shown). Here, the lead frame K1 may be provided with alignment marks for moving the lead frame K1 at one unit interval.

Next, as shown in FIG. 8C, the lead frame K1 is inserted (transferred) into a forming die K2 for one unit by rotating the shaft, and the inserted lead frame K1 is aligned in the forming die K2. The forming die K2 is provided in an injection molding machine for inject-forming the sensor case 20. Next, resin is injected into the forming die K2 so that the sensor case 20 in which the leads 30 and the resin is integrated. After one sensor case 20 is formed, needless portions of the lead frame K1 which are protruded from the resin are cut off by using a cutting die K3. Thus, the sensor case is completed. These steps are repeated every one unit of the lead 30, plural sensor cases 20 can be easily mass-produced.

As described in the above, the sensor element 10 bonded on the seat 11, both transistor elements 12 and 13 are bonded on the completed sensor case 20. After that, wire bonding is performed so as to be the condition shown in FIGS. 2 and 3. The sensor 100 is completed by the sensor case 20 is assembled with the connector case 40.

The sensor 100 operates as a relative pressure sensor and operates as follows. Pressure of the hot water (water) in the passage of the hot water feeder is introduced to a back side of the diaphragm of the sensor 100 through the though hole of the seat 11 from the introduce hole 22.

Incidentally, when a hole (not-shown) communicating with the atmosphere is provided at an adequate portion of the connector case or a gap between both cases 20 and 40 is used for example, a surface of the diaphragm of the sensor element 10 is kept to atmosphere pressure (reference pressure) by communicating with the atmosphere.

When the diaphragm deforms as a result of a pressure difference between both sides of the diaphragm, electric signal is generated in response to this deformation. This signal is taken out to an external terminal connected to the connecting portion 50 via the wire 14, each transistor element 12, 13, the lead 30 and the exposed portion 31 of the lead 30. The pressure in the passage is detected as the relative pressure when the signal is processed in an external circuit, and the water level or the like can be detected based on the detected pressure.

According to this embodiment, since the leads 30 form the connecting portion 50 with the surround portion 42 to be connected to the external terminals, connecting function of the sensor 100 can be realized with simple structure without additional connecting members. Furthermore, since the leads 30 are insert-formed in the sensor case 20 in advance, it is not necessary to additionally weld or solder the leads 30 as the connector. Therefore, this embodiment can provide a semiconductor sensor having a simple structure with low cost.

Furthermore, since the cases 20 and 40 are assembled with each other by connection using the snap fit, it can reduce manufacturing cost compared to conventional assembling method whose the number of process steps or equipment investment is large such as conventional bonding or swaging.

Moreover, since the lead 30 have the flat shape in the plane which is electrically connected to the sensor element 10, it can provide the lead shape suitable for the hoop forming suitable for mass-produce compared to the conventional lead having complicated bending structure, and therefore the insert forming of the lead can be realized at low cost.

(Modification)

In the above embodiment, the lead 30 has the flat shape suitable for the hoop forming. However, the lead 30 does not need to have completely flat shape within the surface which is electrically connected to the sensor element. The lead 30 may slightly wind compared to the flat shape as long as the lead 30 can be rolled into the coil condition as the lead frame. Furthermore, the present invention is applicable to temperature sensors or acceleration sensors using semiconductor sensor elements as the semiconductor sensors.

What is claimed is:

1. A semiconductor sensor comprising:
   a first case made of resin in which a semiconductor sensor element is provided;
   a lead insert-formed in the first case so that a part of the lead is exposed from the first case, wherein the lead is electrically connected to the semiconductor sensor element;
   a second case assembled with the first case for covering the semiconductor sensor element, wherein the second case has a surround portion for surrounding an exposed portion of the lead; and
   a connector portion for connecting an external terminal comprised of the exposed portion and the surrounding portion, wherein the exposed portion connects with the external terminal,
   wherein the lead is flat and coplanar with a plane that is electrically connected to the sensor element.

2. A semiconductor sensor according to claim 1, wherein:
   the first case has a protrusion;
   the second case has a hole portion corresponding to the protrusion; and
   the first case and the second case are assembled by fitting the protrusion into the hole portion.

3. A semiconductor sensor according to claim 1, wherein:
   the second case has a protrusion;
   the first case has a hole portion corresponding to the protrusion; and
   the first case and the second case are assembled by fitting the protrusion into the hole portion.

4. A semiconductor sensor according to claim 1, wherein the surround portion surrounds the exposed portion of the lead with having a predetermined distance between the exposed portion and the surround portion.

5. A semiconductor sensor according to claim 1, wherein the surround portion has a substantially quadrilateral tube body, and surrounds the exposed portion of the lead with having a predetermined distance between the exposed portion and an inner wall of the tube body.

6. A semiconductor sensor comprising:
   a first case having an opening therein;
   a semiconductor sensor element having a planar surface provided in the opening of the first case;
   plate-shaped electrical leads that are substantially straight connected to the semiconductor sensor element and arranged to extend inside and outside the first case in parallel with the planar surface of the semiconductor element; and
   a second case having a cover part and a surround part, wherein the second case is snap-fit engaged with the first case, wherein the cover part covers the opening of the semiconductor sensor element, and the surround part surrounds end parts of the electrical leads extending outside from the first case and extends from the cover part in parallel with the electrical leads.

7. A semiconductor sensor according to claim 6, wherein the surround part has through holes at a connection with the cover part for passing the electrical leads therethrough.

8. A semiconductor sensor according to claim 6, wherein the first case and the second case have a first snap-fit structure and a second snap-fit structure, respectively, for allowing the first case and the second case to be engaged only in a direction of extension of the electric leads.

9. A semiconductor sensor according to claim 6, wherein the first case has an introduction port for introducing a pressure into the opening to be sensed by the semiconductor sensor element.

10. A semiconductor sensor according to claim 6, further comprising:

an amplifier having a planar surface and provided in the opening of the first case and an adjusting circuit having a planar surface and provided in the opening of the first case.

11. A semiconductor sensor according to claim 10, wherein:

the amplifier comprises a bipolar transistor and the adjusting circuit comprises a MOS transistor; and the amplifier, the adjusting circuit and the sensor element are substantially coplanar.

12. A semiconductor sensor according to claim 6, wherein each of the electrical leads is a unitary lead with a uniform width.

* * * * *